United States Patent
Norrod et al.

(10) Patent No.: US 7,949,913 B2
(45) Date of Patent: May 24, 2011

(54) METHOD FOR CREATING A MEMORY DEFECT MAP AND OPTIMIZING PERFORMANCE USING THE MEMORY DEFECT MAP

(75) Inventors: Forrest E. Norrod, Austin, TX (US); Jimmy D. Pike, Georgetown, TX (US); Tom L. Newell, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 341 days.

(21) Appl. No.: 11/838,585

(22) Filed: Aug. 14, 2007

(65) Prior Publication Data
US 2009/0049351 A1 Feb. 19, 2009

(51) Int. Cl.
*G11C 29/00* (2006.01)

(52) U.S. Cl. ............ 714/723; 714/2; 714/5; 714/6; 714/7; 714/8; 714/25; 714/30; 714/42; 714/710; 714/718; 714/719; 714/733; 714/734; 714/736; 714/742; 369/53.17; 711/1; 711/100; 711/202; 711/206; 365/200; 365/201

(58) Field of Classification Search .................. None
See application file for complete search history.

(56) References Cited

U.S. PATENT DOCUMENTS

| | | | |
|---|---|---|---|
| 4,209,846 A | 6/1980 | Seppa | |
| 4,240,143 A | 12/1980 | Besemer et al. | |
| 4,426,688 A | 1/1984 | Moxley | |
| 4,479,214 A | 10/1984 | Ryan | |
| 5,450,576 A | 9/1995 | Kennedy | |
| 5,539,697 A | 7/1996 | Kim et al. | |
| 5,588,112 A | 12/1996 | Dearth et al. | |
| 5,666,482 A | 9/1997 | McClure | |
| 5,671,229 A | 9/1997 | Harari et al. | |
| 5,751,641 A * | 5/1998 | Petrosino | 365/189.05 |
| 5,758,056 A * | 5/1998 | Barr | 714/7 |
| 5,764,878 A | 6/1998 | Kablanian et al. | |
| 5,774,647 A | 6/1998 | Raynham et al. | |
| 5,862,314 A * | 1/1999 | Jeddeloh | 714/8 |
| 5,867,702 A | 2/1999 | Lee | |
| 5,905,858 A * | 5/1999 | Jeddeloh | 714/52 |
| 5,986,950 A | 11/1999 | Joseph | |
| 5,996,096 A * | 11/1999 | Dell et al. | 714/710 |
| 6,035,432 A | 3/2000 | Jeddeloh | |
| 6,052,798 A | 4/2000 | Jeddeloh | |
| 6,125,392 A | 9/2000 | Labatte et al. | |

(Continued)

FOREIGN PATENT DOCUMENTS

EP 0704854 A1 4/1996

(Continued)

OTHER PUBLICATIONS

USPTO Non-Final Rejection for U.S. Appl. No. 11/838,687, dated Mar. 10, 2009.

(Continued)

*Primary Examiner* — John P Trimmings
(74) *Attorney, Agent, or Firm* — Baker Botts L.L.P.

(57) ABSTRACT

A method for storing a memory defect map is disclosed whereby a memory component is tested for defects at the time of manufacture and any memory defects detected are stored in a memory defect map and used to optimize the system performance. The memory defect map is updated and the system's remapping resources optimized as new memory defects are detected during operation.

18 Claims, 6 Drawing Sheets

U.S. PATENT DOCUMENTS

| | | | |
|---|---|---|---|
| 6,154,851 | A | 11/2000 | Sher et al. |
| 6,158,025 | A | 12/2000 | Brisse et al. |
| 6,173,382 | B1 | 1/2001 | Dell et al. |
| 6,237,110 | B1 | 5/2001 | Lin et al. |
| 6,260,127 | B1 | 7/2001 | Olarig et al. |
| 6,285,607 | B1* | 9/2001 | Sinclair ................ 365/200 |
| 6,304,989 | B1 | 10/2001 | Kraus et al. |
| 6,324,657 | B1 | 11/2001 | Fister et al. |
| 6,460,152 | B1 | 10/2002 | Demidov et al. |
| 6,499,117 | B1 | 12/2002 | Tanaka |
| 6,499,120 | B1* | 12/2002 | Sommer ................ 714/723 |
| 6,536,005 | B1 | 3/2003 | Augarten |
| 6,600,614 | B2 | 7/2003 | Lenny et al. |
| 6,601,183 | B1 | 7/2003 | Larson et al. |
| 6,622,269 | B1 | 9/2003 | Ngo et al. |
| 6,728,907 | B1 | 4/2004 | Wang et al. |
| 6,820,224 | B1 | 11/2004 | Lin et al. |
| 6,889,305 | B2* | 5/2005 | Adelmann ................ 711/170 |
| 7,065,630 | B1 | 6/2006 | Ledebohm et al. |
| 7,123,051 | B1 | 10/2006 | Lee et al. |
| 7,246,269 | B1 | 7/2007 | Hamilton |
| 7,251,744 | B1 | 7/2007 | Housty |
| 7,269,765 | B1 | 9/2007 | Charlton et al. |
| 7,272,758 | B2 | 9/2007 | Roohparvar |
| 7,346,755 | B2 | 3/2008 | Pomaranski et al. |
| 7,478,285 | B2* | 1/2009 | Fouquet-Lapar ................ 714/42 |
| 2001/0042225 | A1 | 11/2001 | Cepulis et al. |
| 2002/0073353 | A1 | 6/2002 | Fish et al. |
| 2002/0120826 | A1 | 8/2002 | Venkatraman et al. |
| 2002/0108072 | A1 | 9/2002 | Beng Sim et al. |
| 2002/0157048 | A1 | 10/2002 | Roohparvar |
| 2002/0184445 | A1 | 12/2002 | Cherabuddi |
| 2003/0005367 | A1 | 1/2003 | Lam |
| 2003/0058711 | A1 | 3/2003 | Benedix et al. |
| 2003/0095455 | A1 | 5/2003 | Dono et al. |
| 2003/0145250 | A1 | 7/2003 | Chin |
| 2003/0208654 | A1 | 11/2003 | Krontz et al. |
| 2004/0034825 | A1 | 2/2004 | Jeddeloh |
| 2004/0042293 | A1* | 3/2004 | Ogino ................ 365/202 |
| 2004/0088614 | A1* | 5/2004 | Wu ................ 714/718 |
| 2005/0022066 | A1* | 1/2005 | Herbst ................ 714/42 |
| 2005/0120270 | A1* | 6/2005 | Anand et al. ................ 714/30 |
| 2005/0149687 | A1* | 7/2005 | Adelmann ................ 711/170 |
| 2006/0004942 | A1 | 1/2006 | Hetherington et al. |
| 2006/0059383 | A1 | 3/2006 | Roohparvar |
| 2006/0236165 | A1 | 10/2006 | Cepulis et al. |
| 2007/0061637 | A1* | 3/2007 | Ward et al. ................ 714/718 |
| 2007/0101238 | A1 | 5/2007 | Resnick et al. |
| 2007/0136385 | A1 | 6/2007 | Abrashkevich et al. |
| 2007/0136625 | A1* | 6/2007 | Niijima et al. ................ 714/718 |
| 2007/0150777 | A1* | 6/2007 | Sasaki ................ 714/718 |
| 2007/0174718 | A1 | 7/2007 | Fouquet-Lapar |
| 2007/0217559 | A1 | 9/2007 | Stott et al. |
| 2008/0229143 | A1* | 9/2008 | Muraki ................ 714/5 |
| 2008/0247243 | A1* | 10/2008 | Kang et al. ................ 365/189.07 |

FOREIGN PATENT DOCUMENTS

| | | |
|---|---|---|
| JP | 2005-234744 A | 9/2005 |
| WO | WO98/02816 | 1/1998 |
| WO | 9905599 A1 | 2/1999 |
| WO | WO99/05599 | 4/1999 |
| WO | 9950748 A1 | 10/1999 |

OTHER PUBLICATIONS

Supplementary European Search Report for EP 08 01 4498, dated Mar. 2, 2009.
Supplementary European Search Report for EP 08 01 4500, dated Mar. 2, 2009.
Singapore Office Action for Application No. 200805816-6, dated Mar. 30, 2009.
International Search Report and Written Opinion for Singapore Patent Application No. 200805821-6, dated May 4, 2009.
International Search Report and Written Opinion for Singapore Patent Application No. 200805817-4, dated May 28, 2009.
Partial European Search Report for EP 08 014 502.2 dated Aug. 11, 2009.
USPTO Final Rejection for U.S. Appl. No. 11/838,687, dated May 6, 2009.
USPTO Non-Final Rejection for U.S. Appl. No. 11/838,593, dated Nov. 4, 2009.
Partial European Search Report for 08014500.6, dated Nov. 12, 2008.
Partial European Search Report for 08014498.3, dated Nov. 12, 2008.
Wikipedia—"BIOS Interrupt Call"—http://en.wikipedia.org/wiki/bios_interrupt_call.
Wikipedia—"Interrupt Descriptor Table"—http://en.wikipedia.org/wiki/interrupt_descriptor_table.
USPTO Non-Final Rejection for U.S. Appl. No. 11/838,593 dated Jun. 8, 2010.
USPTO Non-Final Rejection for U.S. Appl. No. 11/838,602 dated Mar. 2, 2010.

\* cited by examiner

METHOD FOR CREATING A MEMORY DEFECT MAP AND OPTIMIZING PERFORMANCE USING THE MEMORY DEFECT MAP

TECHNICAL FIELD

The present disclosure relates generally to computer systems and information handling systems, and, more particularly, to a system and method for creating a map of memory which governs its use by the computer system or information handling system.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

A computing system will typically include some type of temporary information storage medium, such as random access memory. In recent computers, the amount of memory comprised by the information handling system may be on the order of gigabytes. As memory size increases, the likelihood that part of the memory will either be manufactured defective or become defective over time increases. If left unmanaged, the presence of defective memory cells, regardless of their size, can cause the information handling system to fail. Such failure can initiate an abrupt end to the current operation of the information handling system, resulting in the loss of critical data. In addition, the presence of defective memory can prevent the information handling system from starting up altogether.

As computing systems continue to evolve and computer technology advances, the operational relationship between the CPU and memory becomes more significant. Many attributes of modern systems (specifically the introduction of multi-core processors and virtualization in general) are forcing an ever-growing memory footprint. Consequently, not only is system memory growing to be a much more substantial percentage of the overall solution cost, but the impact of erroneous behavior in the memory can have a much more adverse effect on the life cycle expenses associated with the computing system.

SUMMARY

In accordance with the present disclosure, a method for storing a memory defect map is disclosed whereby a memory component is tested for defects at the time of manufacture and any memory defects detected are stored in a memory defect map and used to optimize the system performance. The memory defect map is updated and the system's remapping resources optimized as new memory defects are detected during operation.

A technical advantage of the present invention is that it significantly reduces the cost of an information handling system by allowing the use of memory components with known memory defects without jeopardizing the system performance. Availability of a non-volatile memory defect map allows an information handling system to utilize the memory component without "crashing." Moreover, because the memory defect map is coupled to the memory component, the memory component can be moved from one system to another while retaining any defect information. The importance of this improvement is magnified as the system memory is growing to represent a substantial portion of the overall solution cost.

Another technical advantage of the present invention is that it allows the system to maintain normal operations despite minor deficiencies in the system memory. By minimizing the impact of erroneous memory behavior a system and method in accordance with the present invention can significantly reduce the life cycle expenses associated with an information handling system. Yet another technical advantage of the present disclosure is that it reduces the need for any significant testing and characterization prior to conveying memory defect information to the information handling system. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
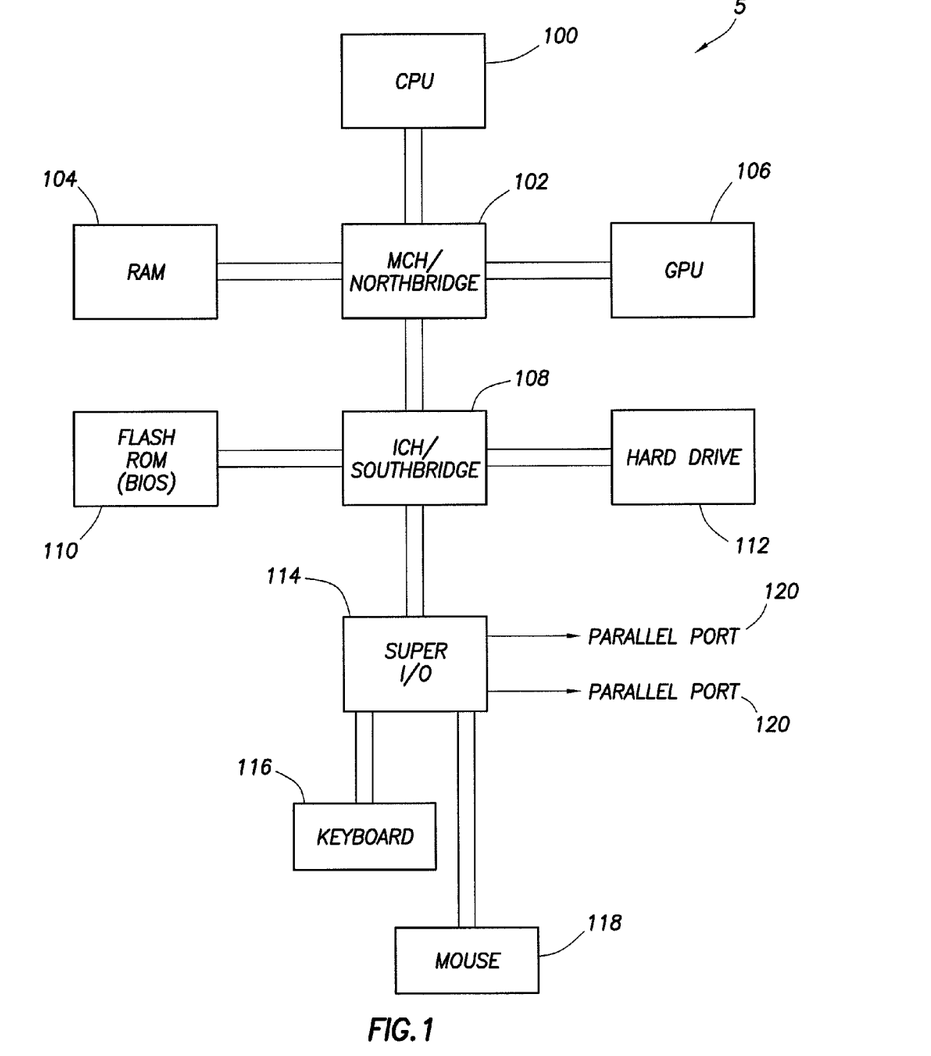
FIG. 1 is a block diagram of the components of an exemplary information handling system.

Shown in FIG. 1 is a block diagram of a typical information handling system. A processor or CPU 100 of the typical information handling system 5 is communicatively coupled to a memory controller hub or north bridge 102. Memory controller hub 102 is coupled to memory 104 and a graphics processing unit 106. Memory controller hub 102 is also coupled to an I/O controller hub or south bridge 108. I/O hub 108 is coupled to storage elements of the computer system, including a storage element 110 such as flash ROM for the Basic Input/Output System (BIOS) of the computer system and the hard drive 112 of the computer system. I/O hub 108 may also be coupled to a Super I/O chip 114, which is itself coupled to many of the I/O ports of the computer system, including keyboard 116, mouse 118, and parallel ports 120.

Figure 2:
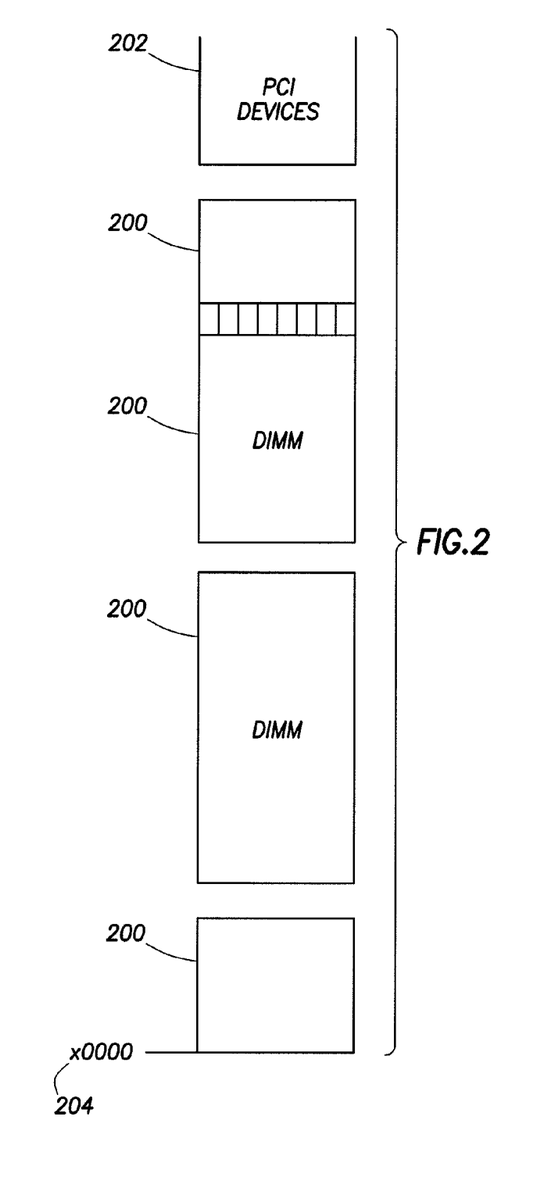
FIG. 2 is a memory mapped by a memory mapping method.

FIG. 2 presents a diagram of the memory mapped by an E820 call or similar memory mapping method. The information handling system may be comprised of numerous distinct components capable of being addressed as memory, including Dual Inline Memory Modules (DIMMs) 200 and PCI devices 202, such as discrete graphics cards. These devices are detected during the BIOS initialization period and mapped to determine the location of system-accessible memory during the E820 call. The E820 call iteratively calls locations which may contain memory, beginning with the lowest possible address 204. As system-accessible memory is located, including DIMMs 200, the E820 call creates a map of such memory, but may exclude portions of memory from the map when designated as unavailable. The memory map is then used by the OS, which only sees the memory mapped as usable by the E820 call.

Figure 3:
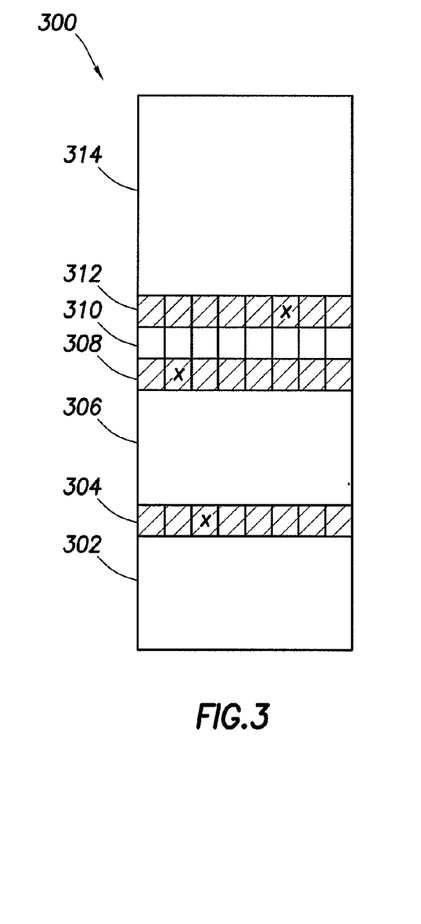
FIG. 3 is a memory space including some defective regions.

FIG. 3 presents an exemplary memory space 300 with some defective regions 304, 308, 312. The exemplary memory space may be part of a DIMM or any other component capable of being addressed as memory. To the extent these defective regions are in existence at the time of manufacture of the memory component, information regarding the location of the defective memory regions will be stored during manufacture. Specifically, the memory component is tested at the time of manufacture and any information regarding the location of defective memory is stored in a nonvolatile storage device. A better understanding of the method in accordance with an embodiment of the present invention may be achieved by turning to FIG. 4.

Figure 4:
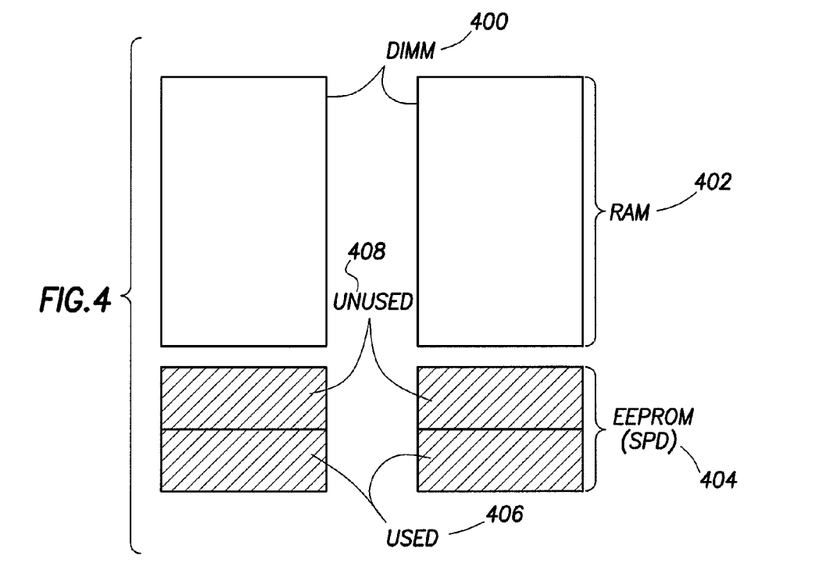
FIG. 4 is a Dual In-line Memory Module with its associated Electrically Erasable Programmable Read-Only Memory.

FIG. 4 presents a block diagram of memory elements in traditional DIMMs 400. Recent DIMMs 400 comprise both RAM 402 and a quantity of Electrically Erasable Programmable Read-Only Memory (EEPROM) 404. EEPROM 404 can store Serial Presence Detect (SPD) information, which comprises data regarding the size, speed, electrical requirements and other information about the RAM 402. Standards of the JEDEC Solid State Technology Association specify that SPD information be stored in the lower 128 bytes 406 of the EEPROM 404, but many recent DIMMs 400 include an additional quantity 408 of EEPROM 404 which is not devoted to SPD information.

Each memory component is tested during or subsequent to being manufactured and any memory defect information is stored in a nonvolatile storage. In one embodiment, the nonvolatile storage is on the memory component itself. In the exemplary embodiment depicted in FIG. 4 the unused portion 408 of the EEPROM 404 is used to store information about the location of defective memory in the RAM 402. Specifically, when a memory cell is identified as defective or it is otherwise determined that the system should not be granted access to that cell, a block of memory containing the memory cell in question is identified and its address is stored in the unused portion 408 of the EEPROM 404. The collection of defective memory locations is known as the memory defect map.

The memory defect map need not be stored in the on-chip EEPROM 404 used for SPD. Rather, any form of non-volatile storage could be utilized to store the map. A standard EEPROM 404 has the advantages of already being widely implemented and at least partially available for storage of the map. It is desirable that the memory map be stored on the DIMM itself, since it is advantageous for the map to remain with the DIMM it maps when, for example, the DIMM is moved from one system to another. Once the DIMM or other memory component is mated to a specific system, the memory defect information which is stored on the DIMM itself can be retrieved and used by the system as part of its memory allocation scheme.

The memory defect information or memory defect map is a map where each entry corresponds to a region of physical address on the memory component. For example, where the memory component is a DIMM, these regions are defined by the DIMM capacity amortized across the number of entries in the map. The size of a memory block designated as defective is thus equal to the DIMM capacity divided by the number of bits in the defect map. As would be appreciated by those of ordinary skill in the art, with the benefit of this disclosure, the memory defect map is not limited to the information stored on the memory component during the manufacture process as disclosed here. For example, defect information may be obtained by an exhaustive software based memory test or an external test mechanism. The stored memory defect map can be used to optimize the system performance in a variety of ways.

In one exemplary embodiment, the memory defect map may be used as a means for avoiding disruption of subsequent memory tests. Memory test are commonly carried out by an information handling system. For example, the BIOS may run an onboard test of the memory components. Typically, the memory test will also analyze the areas in the memory components where defects are already known to exist. Depending on the severity of the defect in the defective region, the analysis of the defective region may disrupt the test and potentially erode the behavior of the test. In one exemplary embodiment the stored memory defect map may be used to avoid redundant testing of regions already known to be defective.

Figure 5:
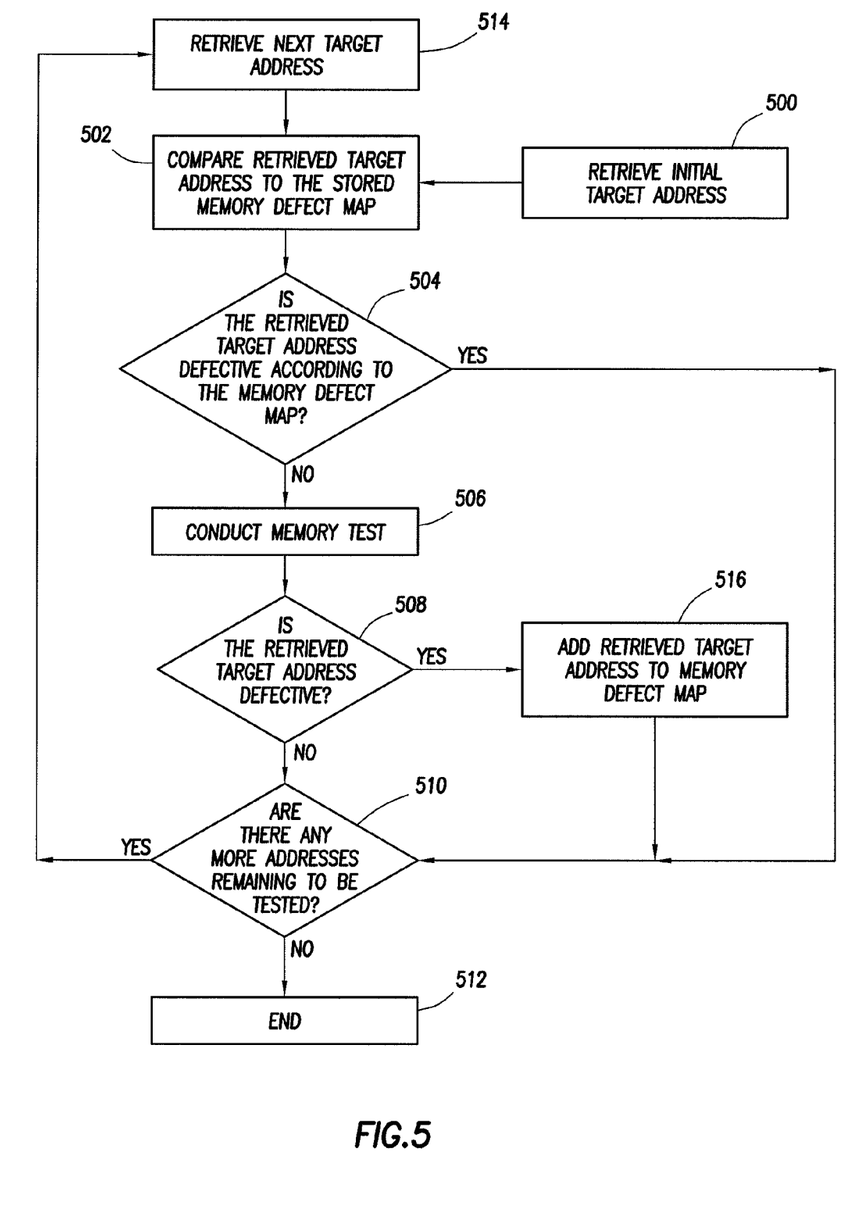
FIG. 5 is a flow diagram of a first method for using a memory defect map to avoid conducting a memory test on a memory location known to be defective.

FIG. 5 depicts a first method for using the stored memory defect map to avoid memory testing of defective memory regions. In this embodiment, the target memory test address is compared to the defective memory information and if it is found to be one of the known defective memory locations, then the testing of each address in the defective region is subsequently skipped and the target test address incremented until an address not contained in the defective region is obtained. First, at step 500 the initial target address for the memory test is retrieved. At step 502, the initial target address is compared with the information in the stored memory defect map. Next, at step 504, the stored memory defect map is used to determine whether the initial target address is an address corresponding to a known defective memory location. If the target address is found in the memory defect map then the memory test will not be conducted on the retrieved target address and the process skips to step 510.

If the target address is not in the memory defect map, then at step 506 a memory test is conducted to determine whether the target address nevertheless contains defective memory locations. As would be appreciated by those of ordinary skill in the art, with the benefit of this disclosure, a number of different tests may be conducted to determine whether the target location is a defective memory space.

At step 508 the result of the memory test is used to decide whether the target address corresponds to a defective memory location. If the target address is not defective then the process will continue to step 510 where it is determined whether there are more memory locations to be tested. If not the process terminates at 512 and if there are more memory locations to be tested, then the next address to be tested as retrieved at 514. In contrast, if the target address is defective then the memory defect map is updated at step 516 and the target address is added to the list of addresses corresponding to defective memory locations before searching for additional locations to be tested.

Figure 6:
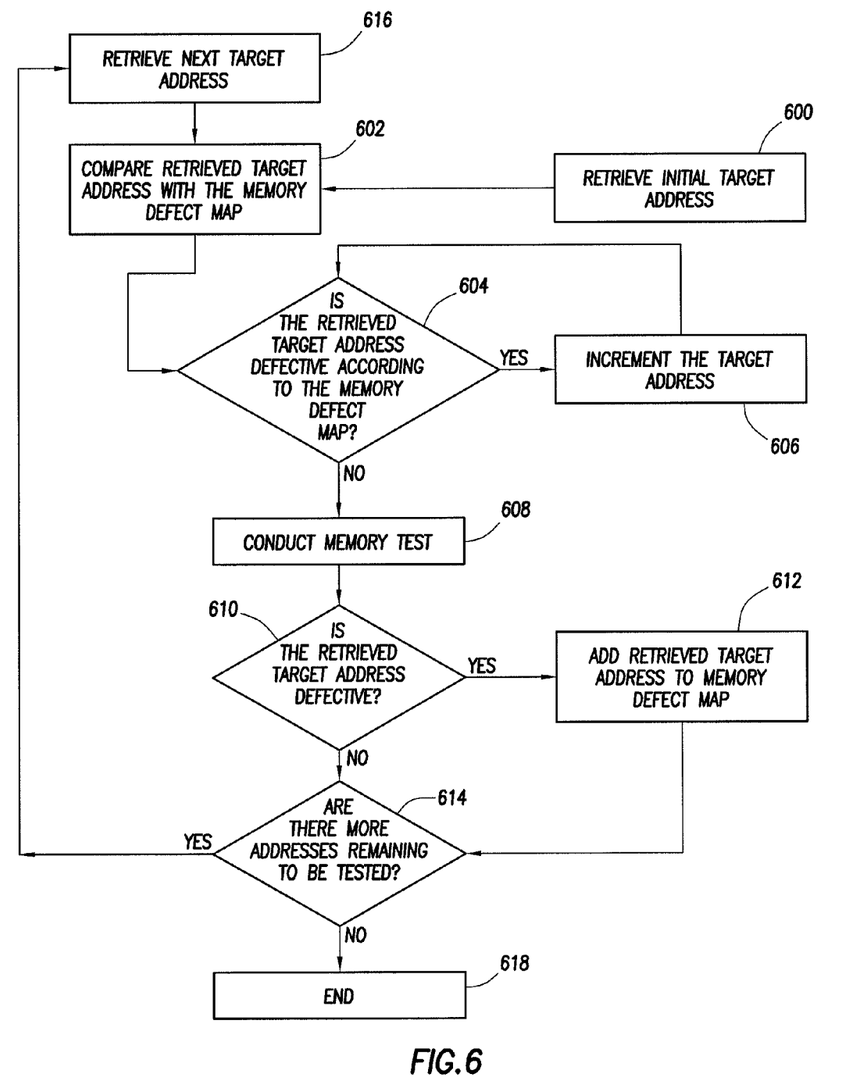
FIG. 6 is a flow diagram of a second method for using a memory defect map to avoid conducting a memory test on a memory location known to be defective.

FIG. 6 depicts a second method for using a stored memory defect map to avoid memory testing of memory regions known to be defective. In this embodiment, once an address in a defective memory location is encountered, the test target address is incremented to reflect the first available address outside of the defective memory region. First, at step 600, the initial test target address is retrieved. At step 602 the retrieved target address is compared with the memory defect map. Next, at step 604 it is determined whether the retrieved target address is listed as defective in the memory defect map. If the retrieved target address matches an entry in the memory defect map, then the target address is incremented at step 606. Iterations are carried out until the first available address that is not listed in the memory defect map is obtained.

The first available target address that is not listed in the memory defect map is then subjected to a memory test at 608. Next, at step 610 it is determined whether the test indicated that the retrieved target address corresponded to a defective memory location. If yes, then the target address is added to the memory defect map at step 612. The process then continues to step 614 where it is determined whether there are any more memory locations that should be subjected to the memory test. If yes, then the next target address is retrieved at step 616 and the process is repeated. The process will finally terminate at step 618 once there are no more memory locations remaining to be tested.

Figure 7:
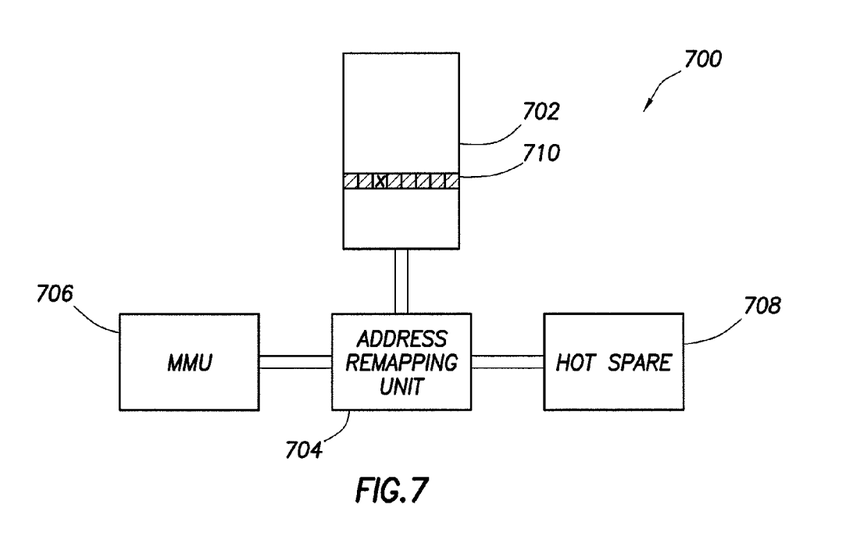
FIG. 7 is a block diagram of the memory remapping resources of an information handling system.

Turning now to FIG. 7, a block diagram of the memory remapping resources of an information handling system is depicted generally with reference numeral 700. The memory component 702 is coupled to address remapping unit 704. The address remapping unit 704 is in turn coupled to the memory management unit (MMU) 706 and the hot spare 708. The MMU is a hardware component responsible for handling accesses to memory requested by the CPU. Hot spare 708 is an extra unused memory space available as substitute for conventional memory in the event an emerging defect renders part of the memory component 702 unreliable. Traditionally, when a portion 710 of the memory component 702 gives rise to a defective memory event, the address remapping unit 704 "maps out" or removes that defective portion 710 from the memory map and substitutes a portion of the spare memory 708 into its place in the memory map. The information existing in the defective portion 710 of the memory component is then corrected and copied into the spare memory 708 preventing the loss of data. Once the remapping has occurred, any subsequent requests for access to the defective memory portion 710 are redirected to the spare memory 708. In information handling systems in accordance with the prior art the remapping process is repeated each time the system is reset.

Figure 8:
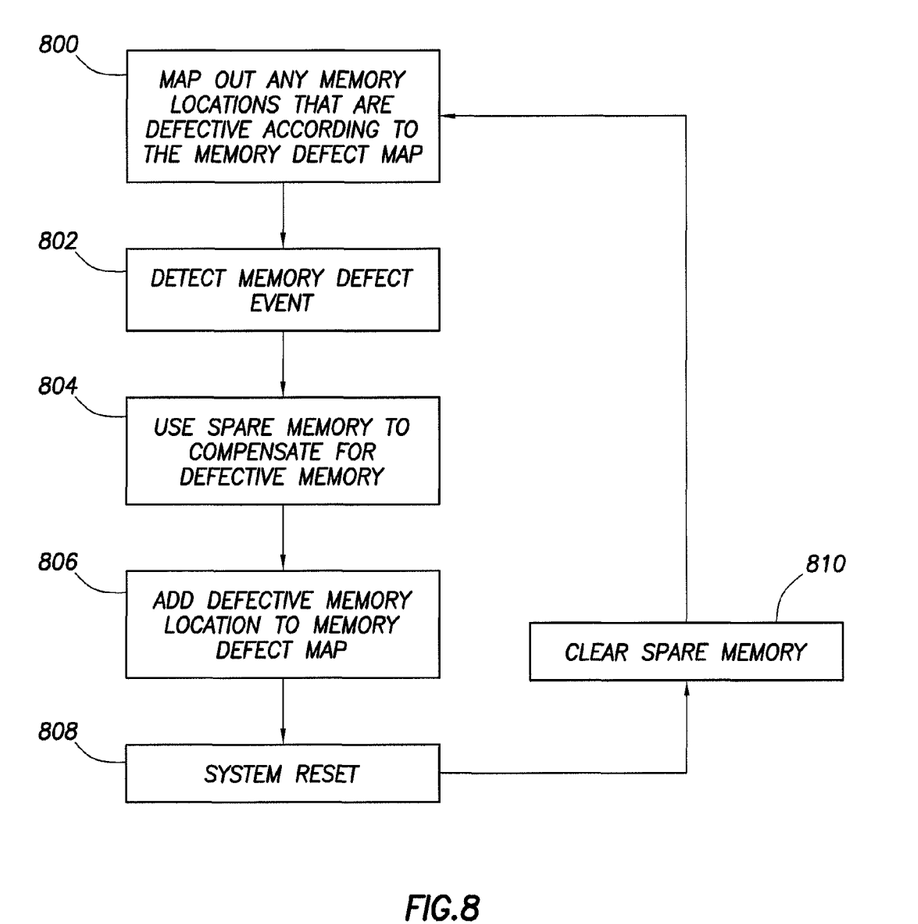
FIG. 8 is a flow diagram of a method for updating a memory defect map and using the stored memory defect map to release the memory remapping resources of a system.

FIG. 8 depicts a method for updating a memory defect map and using the stored memory defect map to release the memory remapping resources of a system in accordance with an embodiment of the present invention. As discussed above, information regarding any defective memory locations detected during the manufacturing process may be stored as a memory defect map on the memory component itself, or on a nonvolatile memory storage coupled to the memory component, in accordance with an embodiment of the present invention. As depicted in FIG. 8, first, at step 800, the address remapping unit 704 maps out any known defective memory locations using the existing memory defect map. Once a memory defect event occurs during the operation of the information handling system, the occurrence of the memory defect event is detected at step 802. At step 804, the address remapping unit 704 uses the spare memory to compensate for the defective memory location. Specifically, a portion of the spare memory 708 is substituted for the defective memory location 710 and the data in the defective memory location is copied into the substituted spare memory location. The defective memory location 710 is then mapped out and any calls for the defective memory location 710 are redirected to the substituted spare memory location 708.

Additionally, at step 806 the defective memory map is updated and the particular defective memory location giving rise to the memory defect event is added to the existing memory defect map. Following a system reset 808 the spare memory is cleared at 810 and the process returns to step 800 with the address remapping unit 704 mapping out any defective memory locations as indicated by the existing memory defect map. Thus, the memory defect map is continuously updated as new memory defect events occur. Because the defective memory information is mapped out, the system ignores any memory locations that are known to be defective. Consequently, the remapping resources that are dedicated to remapping a memory location known to be defective are no longer at risk and can be released and returned to use in the event a new error emerges. Because the memory defect map is continuously updated and any emerging memory defect locations are continuously added to the memory defect map, the demand on the system's remapping resources will be minimized.

What is claimed is:

1. A method of storing a memory defect map comprising:
testing a memory component for defective memory locations;
wherein the testing is conducted when manufacturing the memory component;
storing memory defect information in a memory defect map, wherein the memory defect information is based, at least in part, on the defective memory locations;
retrieving a first target test address; and
determining whether the first target test address is included in the memory defect map corresponding to the memory component, wherein the first target test address is incremented to obtain a second target test address if it is determined that the first target test address is included in the memory defect map.

2. The method of claim 1, wherein the memory defect map is stored on the memory component.

3. The method of claim 1, wherein the memory component is a Dual In-Line Memory Module.

4. The method of claim 3, wherein the memory defect map is stored in an Electrically Erasable Programmable Read-Only Memory corresponding to the Dual In-Line Memory Module.

5. The method of claim 1, wherein the memory defect map is stored in a non-volatile memory storage.

6. The method of claim 5, wherein the non-volatile memory storage is coupled to the memory component.

7. The method of claim 1, wherein the memory defect map is transferable with the memory component from a first information handling system to a second information handling system.

8. The method of claim 1, further comprising:
conducting a memory test on the first target test address if the first target test address does not contain a defective memory location.

9. The method of claim 1, further comprising:
updating the memory defect map when a memory defect event occurs; and
mapping out a memory location indicated to be defective by the memory defect map.

10. A method of optimizing a memory test of a memory component comprising:
retrieving a first target test address;
determining whether the first target test address is included in a memory defect map corresponding to the memory component, wherein the first target test address is incremented to obtain a second target test address if it is determined that the first target test address is included in the memory defect map; and
conducting a memory test on the first target test address if the first target test address is not included in the memory defect map.

11. The method of claim 10, wherein the memory defect map is stored on the memory component at the time of manufacture.

12. The method of claim 11, wherein the memory component is a Dual In-line Memory Module.

13. The method of claim 12, wherein the memory defect map is stored on an Electrically Erasable Programmable Read-Only Memory corresponding to the Dual In-Line Memory Module.

14. The method of claim 10, further comprising:
conducting the memory test on the second target test address if the second target test address is not included in the memory defect map.

15. The method of claim 10, wherein if the target test address is in the memory defect map the target test address is repeatedly incremented to obtain a first target test address that is not included in the memory defect map.

16. The method of claim 15, further comprising conducting the memory test on the first target test address.

17. The method of claim 10, further comprising updating the memory defect map if the target test address subjected to the memory test contains defective memory.

18. The method of claim 10, wherein the memory defect map is stored in a non-volatile memory storage.

* * * * *